(12) United States Patent
Ishii et al.

(10) Patent No.: US 7,638,873 B2
(45) Date of Patent: *Dec. 29, 2009

(54) WIRED CIRCUIT BOARD

(75) Inventors: Jun Ishii, Osaka (JP); Yasuhito Funada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 280 days.

This patent is subject to a terminal disclaimer.

(21) Appl. No.: 11/606,021

(22) Filed: Nov. 30, 2006

(65) Prior Publication Data

US 2007/0128417 A1    Jun. 7, 2007

(30) Foreign Application Priority Data

Dec. 1, 2005    (JP) ............................ 2005-348061

(51) Int. Cl.
*H01L 23/04* (2006.01)

(52) U.S. Cl. .................. 257/698; 174/251; 174/255; 174/257; 174/258; 257/700

(58) Field of Classification Search ......... 174/250–258; 257/698, 700
See application file for complete search history.

(56) References Cited

U.S. PATENT DOCUMENTS

| | | | |
|---|---|---|---|
| 5,612,512 A | 3/1997 | Wakamatsu et al. | |
| 5,666,717 A | 9/1997 | Matsumoto et al. | |
| 5,796,552 A | 8/1998 | Akin, Jr. et al. | |
| 5,857,257 A | 1/1999 | Inaba | |
| 5,995,329 A | 11/1999 | Shiraishi et al. | |
| 6,100,582 A * | 8/2000 | Omote et al. | 257/699 |
| 6,147,876 A | 11/2000 | Yamaguchi et al. | |
| 6,162,996 A | 12/2000 | Schmidt et al. | |
| 6,242,103 B1 | 6/2001 | Farnworth et al. | |
| 6,399,899 B1 | 6/2002 | Ohkawa et al. | |
| 6,480,359 B1 | 11/2002 | Dunn et al. | |
| 6,602,584 B2 | 8/2003 | Jo et al. | |
| 6,735,052 B2 | 5/2004 | Dunn et al. | |
| 7,013,561 B2 | 3/2006 | Nakatani et al. | |
| 7,067,912 B2 | 6/2006 | Takeuchi et al. | |

(Continued)

FOREIGN PATENT DOCUMENTS

CN    1339822    3/2002

(Continued)

*Primary Examiner*—Cathy Lam
(74) *Attorney, Agent, or Firm*—Jean C. Edwards, Esq.; Akerman Senterfitt

(57) ABSTRACT

A wired circuit board is provided which can reduce transmission loss with a simple layer structure and also features excellent long-term reliability by preventing the occurrence of an ion migration phenomenon between a metal foil and an insulating layer to improve the adhesion between the metal foil and the insulating layer and the conductivity of a conductor. A metal supporting board is prepared and a first metal thin film is formed on the metal supporting board by sputtering or electrolytic plating. A metal foil is formed on the first metal thin film by electrolytic plating. A second metal thin film is formed over the metal foil and the metal supporting board by electroless plating or sputtering. An insulating base layer is formed on the second metal thin film. A conductive pattern is formed as a wired circuit pattern on the insulating base layer. An insulating cover layer is formed on the insulating base layer to cover the conductive pattern.

2 Claims, 2 Drawing Sheets

U.S. PATENT DOCUMENTS

| | | |
|---|---|---|
| 7,182,606 B2 * | 2/2007 | Ishii et al. .................... 439/66 |
| 7,319,573 B2 | 1/2008 | Nishiyama |
| 2002/0074662 A1 | 6/2002 | Hong et al. |
| 2002/0100609 A1 | 8/2002 | Ookawa et al. |
| 2004/0173375 A1 | 9/2004 | Lee et al. |
| 2004/0245015 A1 | 12/2004 | Yoshimi et al. |
| 2004/0245619 A1 | 12/2004 | Takeuchi et al. |
| 2004/0246626 A1 | 12/2004 | Wakaki et al. |
| 2004/0252413 A1 | 12/2004 | Nishiyama |
| 2005/0061542 A1 | 3/2005 | Aonuma et al. |
| 2005/0122627 A1 | 6/2005 | Kanagawa et al. |
| 2005/0186332 A1 | 8/2005 | Funada et al. |
| 2006/0199402 A1 | 9/2006 | Ishii et al. |

FOREIGN PATENT DOCUMENTS

| | | |
|---|---|---|
| CN | 1415474 A | 5/2003 |
| EP | 1592290 | 11/2005 |
| JP | 59-219492 | 12/1984 |
| JP | 1-150390 | 6/1989 |
| JP | 3-274799 | 12/1991 |
| JP | 05-304345 | 11/1993 |
| JP | 08-307020 | 11/1996 |
| JP | 9-282624 | 10/1997 |
| JP | 2000-513861 | 10/2000 |
| JP | 2001-085842 | 3/2001 |
| JP | 2001-256627 | 9/2001 |
| JP | 2002-057437 | 2/2002 |
| JP | 2004-363205 | 12/2004 |
| JP | 2004-363331 | 12/2004 |
| JP | 2005-11387 | 1/2005 |
| JP | 2005-158973 | 6/2005 |
| JP | 2005-235318 | 9/2005 |
| JP | 2006-173399 | 6/2006 |
| JP | 2006-245220 | 9/2006 |

* cited by examiner (a)

(b)

(c)

(d)

(e)

(f)

(g)

(h)

US 7,638,873 B2

WIRED CIRCUIT BOARD

CROSS REFERENCE TO RELATED APPLICATION

This application claims priority from Japanese Patent Appln. No. 2005-348061, filed Dec. 1, 2005, the contents of which are herein incorporated by reference in their entirety.

BACKGROUND OF THE INVENTION

1. Field of the Invention

The present invention relates to a wired circuit board and, more particularly, to a wired circuit board such as a suspension board with circuit.

2. Description of Related Art

There has been conventionally known a suspension board with circuit including a metal supporting board made of stainless steel, an insulating layer made of a resin, and a conductive pattern made of copper, which are formed successively on the metal supporting board.

In such a suspension board with circuit, a metal supporting board is made of stainless steel, so that a transmission loss is increased in a conductive pattern.

To reduce the transmission loss, it has been proposed that a lower conductor made of copper or a copper alloy containing mainly copper is formed on a suspension made of stainless steel and then an insulating layer, a conductor on the recording side and a conductor on the playback side are successively formed on the lower conductor (see, e.g., Japanese Unexamined Patent Publication No. 2005-11387).

However, in the proposal mentioned above, the insulating layer is formed directly on the lower conductor so that an ion migration phenomenon occurs in which the copper or the copper alloy containing mainly copper of the lower conductor migrates to a surface of the insulating layer or to the inner portion thereof with moisture or water absorption by the insulating layer in the presence of an electric current or voltage. This occasionally causes defective adhesion between the lower conductor and the insulating layer or defective conductivity of the conductors on the recording and playback sides.

SUMMARY OF THE INVENTION

It is therefore an object of the present invention to provide a wired circuit board which can reduce in transmission loss with a simple layer structure and also features excellent long-term reliability by preventing the occurrence of an ion migration phenomenon between a metal foil and an insulating layer to improve the adhesion between the metal foil and the insulating layer and the conductivity of a conductor.

A wired circuit board according to the present invention comprises: a metal supporting board; a first metal thin film formed on the metal supporting board; a metal foil formed on the first metal thin film; a second metal thin film formed on the metal foil; an insulating layer formed on the second metal thin film; and a conductive pattern formed on the insulating layer.

In the wired circuit board according to the present invention, the metal foil is preferably made of copper and the second metal thin film is preferably made of at least one metal selected from the group consisting of nickel, chromium, and an alloy of nickel and chromium.

The wired circuit board according to the present invention can reduce transmission loss. Moreover, since the second metal thin film is formed between the metal foil and the insulating layer, the occurrence of the ion migration phenomenon between the metal foil and the insulating layer is prevented with the simple layer structure. As a result, it is possible to sufficiently improve the adhesion between the metal foil and the insulating layer as well as the conductivity of the conductor to ensure excellent long-term reliability.

BRIEF DESCRIPTION OF THE DRAWINGS

FIG. 3 is a production process drawing illustrating a production method of the wired circuit board shown in FIG. 1, of which:

(a) shows the step of forming a first metal thin film on a metal supporting board by sputtering or electrolytic plating;

(b) shows the step of forming a resist in a pattern reverse to that of a metal foil;

(c) shows the step of forming the metal foil on the portion of the first metal thin film exposed from the resist by electrolytic plating;

(d) shows the step of removing the resist and the portion of the first metal thin film on which the resist is formed;

(e) shows the step of forming a second metal thin film over the metal foil and the metal supporting board;

(f) shows the step of forming an insulating base layer on the second metal thin film;

(g) shows the step of forming a conductive pattern on the insulating base layer; and (h) shows the step of forming an insulating cover layer on the insulating base layer to cover the conductive pattern.

DESCRIPTION OF THE PREFERRED EMBODIMENTS

Figure 1:
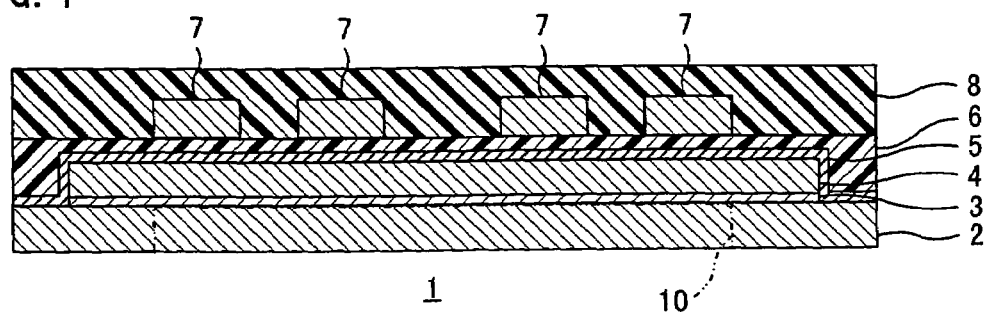
FIG. 1 is a cross-sectional view showing a principal portion of a wired circuit board according to an embodiment of the present invention.

FIG. 1 is a cross-sectional view showing a principal portion of a wired circuit board according to an embodiment of the present invention.

In FIG. 1, a wired circuit board 1 is a suspension board with circuit which is mounted in a hard disk drive and comprises a first metal thin film 3 formed on a metal supporting board 2 extending in a longitudinal direction, a metal foil 4 formed on the first metal thin film 3, a second metal thin film 5 formed on the metal foil 4, an insulating base layer 6 formed on the second metal thin film 5 and a conductive pattern 7 formed on the insulating base layer 6. The wired circuit board 1 comprises an insulating cover layer 8 formed on the conductive pattern 7 as necessary.

The metal supporting board 2 is made of metal foil or a metal thin plate in the form of a flat plate. Examples of the metal used to form the metal supporting board 2 include stainless steel and a 42-alloy. Preferably, stainless steel is used. The thickness of the metal supporting board 2 is in the range of, e.g., 15 to 30 μm or preferably 20 to 25 μm.

The first metal thin film 3 is formed in a pattern on a surface of the metal supporting board 2 to face the portion over which the metal foil 4 is formed. Examples of the metal used to form the first metal thin film 3 include chromium, gold, silver, platinum, nickel, titanium, silicon, manganese, zirconium, and alloys thereof, or oxides thereof. The thickness of the first metal thin film 3 is in the range of, e.g., 0.01 to 1 μm or preferably 0.1 to 1 μm.

The first metal thin film 3 can also be formed to have a multilayer structure in consideration of the adhesion between the metal supporting board 2 and the metal foil 4 in such a manner that, e.g., a first layer of the first metal thin film 3 which is made of a metal having excellent adhesion to the metal supporting board 2 is formed on a surface of the metal supporting board 2, and then a second layer of the first metal thin film 3 which is made of a metal having excellent adhesion to the metal foil 4, is formed in laminated relation on a surface of the first layer of the first metal thin film 3.

The metal foil 4 is formed in a pattern on a surface of the first metal thin film 3 to face at least the portion over which the conductive pattern 7 is formed. As an example of the metal for forming the metal foil 4, copper is preferably used. The thickness of the metal foil 4 is in the range of, e.g., 1 to 5 μm or preferably 2 to 4 μm.

The second metal thin film 5 is formed on a surface of the metal foil 4 to cover the metal foil 4. To form the second metal thin film 5, the same metal as used to form the first metal thin film 3 shown above is used. Examples of the metal used preferably to form the second metal thin film 5 include nickel, chromium, and an alloy of nickel and chromium (nichrome). To reduce the transmission loss of an electric signal transmitted in the conductive pattern 7, which will be described later, chromium is more preferably used. The thickness of the second metal thin film 5 is, e.g., not more than 3 μm, preferably not more than 0.5 μm, and normally not less than 0.003 μm.

The insulating base layer 6 is formed on a surface of the second metal thin film 5 to cover the second metal thin film 5. As the insulator for forming the insulating base layer 6, a synthetic resin normally used as an insulator for a wired circuit board is used. Examples of the synthetic resin include polyimide, polyethernitrile, polyethersulfone, polyethylene terephthalate, polyethylene naphthalate, and polyvinyl chloride. Among these examples, a photosensitive synthetic resin is preferably used. More preferably, photosensitive polyimide is used. The thickness of the insulating base layer 6 is in the range of, e.g., 5 to 15 μm and preferably 8 to 10 μm.

The conductive pattern 7 is formed as a wired circuit pattern comprising a plurality of wires lines (e.g., four wires) which are arranged on a surface of the insulating base layer 6 in longitudinally parallel and mutually spaced-apart relation. As the conductor for forming the conductive pattern 7, a metal normally used as a conductor for a wired circuit board is used. Examples of the metal include copper, nickel, gold, a solder, and alloys thereof. Among these examples, copper is preferably used. The thickness of the conductive pattern 7 is in the range of, e.g., 5 to 20 μm or preferably 7 to 15 μm. The width of each of the wires is in the range of, e.g., 15 to 100 μm or preferably 20 to 50 μm. The spacings between the individual wires are in the range of, e.g., 15 to 100 μm and preferably 20 to 50 μm.

The insulating cover layer 8 is formed on the surface of the insulating base layer 6 to cover the conductive pattern 7. To form the insulating cover layer 8, the same insulator as used to form the insulating base layer 6 shown above is used. The thickness of the insulating cover layer 8 is in the range of, e.g., 3 to 10 μm and preferably 4 to 5 μm.

Figure 3:
Figure 3:
Figure 3:
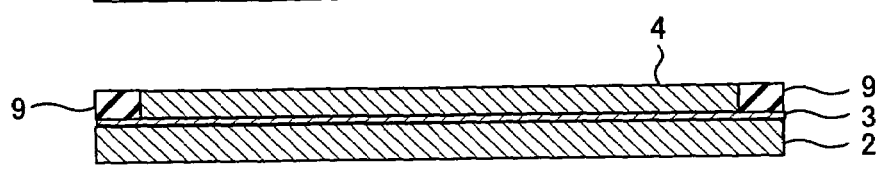
Figure 3:
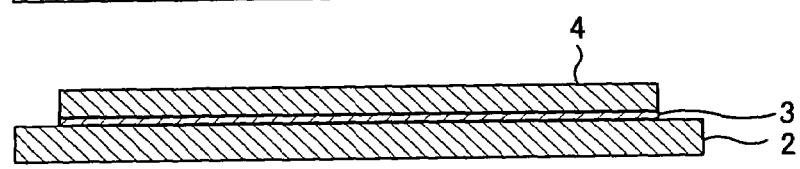
Figure 3:
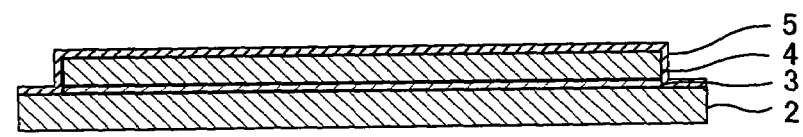
Figure 3:
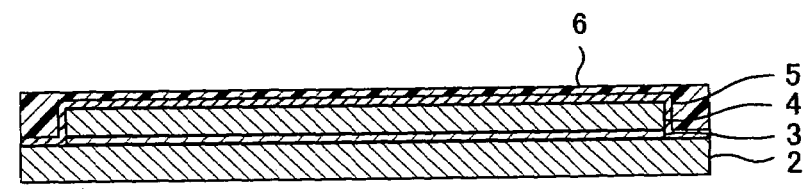
Figure 3:
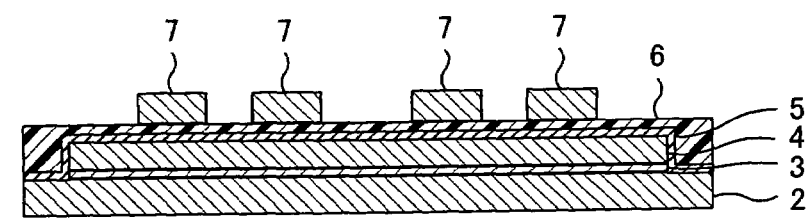
Figure 3:
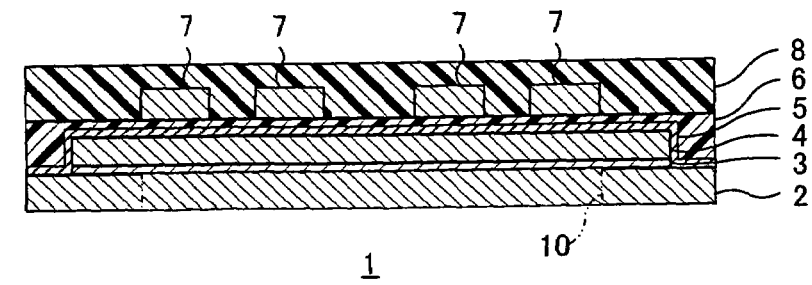

The wired circuit board 1 shown in FIG. 1 can be produced in accordance with the method illustrated in, e.g., FIG. 3.

First, as shown in FIG. 3(a), the metal supporting board 2 is prepared and the first metal thin film 3 is formed on the entire surface of the metal supporting board 2 by sputtering or electrolytic plating.

Then, as shown in FIG. 3(b), a resist 9 is formed in a pattern reverse to that of the metal foil 4 mentioned above. The resist 9 is formed by a known method which involves, e.g., exposure to light and development using a dry film resist.

Next, as shown in FIG. 3(c), the metal foil 4 is formed on the entire surface of the portion of the first metal thin film 3 exposed from the resist 9 by electrolytic plating, preferably electrolytic copper plating, using the resist 9 as a plating resist.

Then, as shown in FIG. 3(d), the resist 9 and the portion of the first metal thin film 3 on which the resist 9 is formed are removed by, e.g., a known etching method such as chemical etching (wet etching) or peeling it off.

Next, as shown in FIG. 3(e), the second metal thin film 5 is formed over the surfaces (upper and side surfaces) of the metal foil 4 and the surface (upper surface) of the metal supporting board 2 by electroless plating or sputtering.

Then, as shown in FIG. 3(f), a solution of, e.g., the synthetic resin shown above (varnish) is uniformly applied to the entire surface of the second metal thin film 5, dried, and then heated as necessary to be cured, so that the insulating base layer 6 made of the synthetic resin is formed. The insulating base layer 6 can also be formed in a pattern by exposing a photosensitive synthetic resin to light and developing it. The formation of the insulating base layer 6 is not particularly limited to the method described above. For example, it is also possible to, e.g., preliminarily form the synthetic resin into a film and then bond the film to the surface of the second metal thin film 5 via a known adhesive layer.

Next, as shown in FIG. 3(g), the conductive pattern 7 is formed in the wired circuit pattern described above by a known patterning method such as an additive method or a subtractive method.

When patterning is performed by, e.g., the additive method, a thin conductive film serving as an underplate is formed on the entire surface of the insulating base layer 6 by, e.g., a vacuum vapor deposition method or a sputtering method. Then, a plating resist having a pattern reverse to the wired circuit pattern is formed on a surface of the thin conductive film by exposing a dry film resist or the like to light and developing it. Subsequently, the conductive pattern 7 is formed as the wired circuit pattern on the surface of the portion of the thin conductive film exposed from the plating resist by plating. Then, the plating resist and the portion of the thin conductive film on which the plating resist is formed are removed by etching or the like. Plating may be either electrolytic plating or electroless plating. Preferably, electrolytic plating is used and, more preferably, electrolytic copper plating is used.

When patterning is performed by, e.g., the subtractive method, a conductor layer is first formed on the entire surface of the insulating base layer 6. The formation of the conductor layer is not particularly limited. For example, a conductor layer is bonded to the entire surface of the insulating base layer 6 via a known adhesive layer. Then, an etching resist having the same pattern as the wired circuit pattern is formed on a surface of the conductor layer by exposing a dry film resist or the like to light and developing it. Thereafter, the portion of the conductor layer exposed from the etching resist is etched (wet-etched) and then the etching resist is removed.

Next, as shown in FIG. 3(h), a solution of the synthetic resin mentioned above is uniformly applied to the surface of the insulating base layer 6 to cover the conductive pattern 7, dried, and then heated as necessary to be cured. As a result, the insulating cover layer 8 made of the synthetic resin is formed, whereby the wired circuit board 1 is obtained. The insulating cover layer 8 can also be formed in a pattern by exposing a photosensitive synthetic resin to light and developing it. The formation of the insulating cover layer 8 is not particularly limited to the method described above. For example, it is also possible to preliminarily form the synthetic resin into a film and then bond the film to the surface of the insulating base layer 6 to cover the conductive pattern 7 with the film via a known adhesive layer.

The insulating cover layer 8 is formed such that the portions of the conductive pattern 7 which serve as terminal portions are exposed from the insulating cover layer 8, though they are not shown. To expose the portions of the conductive pattern 7 which serve as the terminal portions, the insulating cover layer 8 is formed in a pattern using the photosensitive synthetic resin mentioned above or perforated by a laser or punching.

Figure 2:
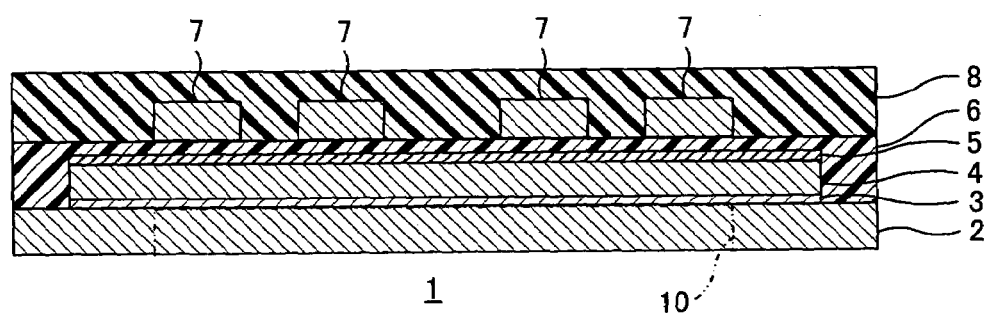
FIG. 2 is a cross-sectional view showing a principal portion of a wired circuit board according to another embodiment of the present invention.

FIG. 2 is a cross-sectional view showing a principal portion of a wired circuit board according to another embodiment of the present invention.

The wired circuit board 1 shown in FIG. 2 is obtained by removing the second metal thin film 5 from the side surfaces of the metal foil 4 and from the upper surface of the metal supporting board 2 in the wired circuit board 1 shown in FIG. 1.

In the wired circuit board 1 shown in FIG. 2, to remove the second metal thin film 5 formed on the side surfaces of the metal foil 4 and on the upper surface of the metal supporting board 2 therefrom, e.g., an etching resist or the like is formed on, e.g., the second metal thin film 5 covering the upper surface of the metal foil 4 after the step of FIG. 3(e) and then the portions of the second metal thin film 5 which are formed on the side surfaces of the metal foil 4 and on the upper surface of the metal supporting board 2 and exposed from the etching resist are etched.

In the wired circuit board 1 thus obtained, the metal foil 4 is laminated on the metal supporting board 2 through the first metal thin film 3 interposed therebetween, as shown in FIG. 1. In the case where only the metal supporting board 2 is provided without the metal foil 4, a transmission loss in the conductive pattern 7 facing the metal supporting board 2 is undesirably increased. However, by thus interposing the metal foil 4 between the metal supporting board 2 and the conductive pattern 7, the metal foil 4 serves as a ground layer, whereby the transmission loss in the conductive pattern 7 can be reduced.

In addition, in the wired circuit board 1 thus obtained, the insulating base layer 6 is laminated on the metal foil 4 through the second metal thin film 5 interposed therebetween, as shown in FIG. 1 or 2. In the case where the insulating base layer 6 is laminated directly on the metal foil 4, the ion migration phenomenon undesirably occurs between the metal foil 4 and the insulating base layer 6. However, by thus interposing the second metal thin film 5 between the metal foil 4 and the insulating base layer 6, the second metal thin film 5 serves as a barrier layer, whereby the occurrence of the ion migration phenomenon can be prevented. Moreover, by interposing the second metal thin film 5 between the metal foil 4 and the insulating base layer 6, it is possible to sufficiently improve the adhesion between the metal foil 4 and the insulating base layer 6 as well as the conductivity of the conductive pattern 7 and ensure excellent long-term reliability with the simple layer structure. In particular, by forming the metal foil 4 of copper and forming the second metal thin film 5 of nickel, chromium, or an alloy of nickel and chromium, the adhesion between the metal foil 4 and the insulating base layer 6 and the conductivity of the conductive pattern 7 can be further improved.

To adjust the characteristic impedance of the wired circuit board 1, an opening 10 can also be formed in the metal supporting board 2 as necessary by etching the metal supporting board 2 and cutting it into a desired shape, as shown in FIGS. 1 and 2.

In the conventional wired circuit board, when the opening 10 is thus formed by etching in the metal supporting board 2, the metal foil 4 is also etched since it is laminated directly on the metal supporting board 2.

In the wired circuit board 1, however, the first metal thin film 3 is laminated on the metal supporting board 2 and the metal foil 4 is laminated on the first metal thin film 3. As a result, when the opening 10 is formed by etching in the metal supporting board 2, the first metal thin film 3 serves as a barrier layer, whereby the metal foil 4 from being etched can be prevented.

EXAMPLES

The present invention is described more specifically by showing the examples and comparative example thereof herein below. However, the present invention is by no means limited to the examples and the comparative example.

Example 1

A chromium thin film with a thickness of 0.03 μm and a copper thin film with a thickness of 0.07 μm were successively formed by sputtering as a first metal thin film on a metal supporting board made of a stainless steel with a thickness of 25 μm (see FIG. 3(a)). A plating resist in a pattern reverse to that of a metal foil was formed using a dry film resist (see FIG. 3(b)). Subsequently, a copper foil with a thickness of 4.0 μm was formed as a metal foil on the entire surface of the portion of the first metal thin film exposed from the plating resist by electrolytic copper plating (see FIG. 3(c)). Then, the plating resist and the portion of the first metal thin film on which the plating resist was formed were removed by chemical etching (see FIG. 3(d)). Thereafter, a nickel thin film with a thickness of 0.1 μm was formed as a second metal thin film over a surface of the metal foil and the metal supporting board by electroless plating (see FIG. 3(e)). Then, a varnish of a photosensitive polyamic acid resin was applied to a surface of the second metal thin film, exposed to light, developed, and further heated to be cured so that an insulating base layer made of a polyimide resin with a thickness of 10 μm was formed in a pattern which covers a surface of the second metal thin film (see FIG. 3(f)). Subsequently, a conductive pattern made of copper with a thickness of 10 μm was formed in a wired circuit pattern on a surface of the insulating base layer by the additive method (see FIG. 3(g)). Then, a varnish of a photosensitive polyamic acid resin was further applied to cover the conductive pattern, exposed to light, developed, and further heated to be cured, so that an insulating cover layer made of a polyimide resin with a thickness of 5 μm was formed in a pattern which covers the entire surface of the conductive pattern (except for the terminal portions) on the insulating base layer (see FIG. 3(h)). Thereafter, the terminal portions were plated with gold and the metal supporting board was cut into a desired shape by etching, whereby a suspension board with circuit was obtained.

Example 2

A suspension board with circuit was obtained in the same manner as in Example 1 except that a chromium thin film with a thickness of 0.01 μm was formed as the second metal thin film by sputtering.

Comparative Example 1

A suspension board with circuit was obtained in the same manner as in Example 1 except that the insulating base layer was formed directly on the metal foil without forming the second metal thin film.

Evaluation (Evaluation of Ion Migration Phenomenon)

Each of the suspension boards with circuit obtained in the individual examples and comparative example was used for 1000 hours under conditions such that a temperature was 85° C., a humidity was 85%, and an applied voltage was 10 V. Thereafter, the presence of the ion migration phenomenon in which the copper of the copper foil as the metal foil migrates to the surface of the polyimide resin as the insulating base layer or to the inner portion thereof was determined by a cross-sectional SEM observation. As a result, in each of Examples 1 and 2, the second metal thin film served as the barrier layer, so that the ion migration phenomenon was not observed. In Comparative Example 1, by contrast, the ion migration phenomenon of the copper migrated from the copper foil to the surface of the polyimide resin or to the inner portion thereof was observed and the discoloration of the polyimide resin was detected.

(Evaluation of Transmission Efficiency)

In each of the suspension boards with circuit obtained in the individual examples and comparative example, an output signal intensity ($P_{OUT}$) and an input signal intensity ($P_{IN}$) were measured and the transmission efficiency was evaluated as the ratio of the output signal intensity to the input signal intensity given by the following formula (1). Table 1 shows the results of the evaluation.

$$\text{Transmission Efficiency}(\%) = P_{OUT}/P_{IN} \qquad (1)$$

TABLE 1

|  | Example 1 | Example 2 | Comparative Example 1 |
|---|---|---|---|
| Transmission Efficiency ($P_{OUT}/P_{IN}$) (%) | 79.1 | 85.3 | 78.0 |

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:

a metal supporting board;

a first metal thin film formed on the metal supporting board;

a metal foil formed on the first metal thin film;

a second metal thin film formed on the metal foil;

an insulating layer formed on the second metal thin film; and a conductive pattern formed on the insulating layer.

2. A wired circuit board according to claim 1, wherein the metal foil is made of copper, and the second metal thin film is made of at least one metal selected from the group consisting of nickel, chromium, and an alloy of nickel and chromium.

* * * * *